United States Patent [19]
Umeda

[11] Patent Number: 5,939,922
[45] Date of Patent: Aug. 17, 1999

[54] INPUT CIRCUIT DEVICE WITH LOW POWER CONSUMPTION

[75] Inventor: Toshiyuki Umeda, Tokyo, Japan

[73] Assignee: Kabushiki Kaisha Toshiba, Kawasaki, Japan

[21] Appl. No.: 08/712,416

[22] Filed: Sep. 11, 1996

[30] Foreign Application Priority Data

Sep. 13, 1995 [JP] Japan ................................ 7-235426

[51] Int. Cl.$^6$ ................... H03K 19/0185; H03K 19/018
[52] U.S. Cl. ................ 327/333; 327/320; 327/256; 327/274; 326/68; 326/75; 330/252
[58] Field of Search .................. 327/333, 318, 327/319, 320, 325, 327, 314, 430, 431, 482, 52, 55, 231, 237, 238, 246, 247, 254, 255, 257, 258, 274, 278, 280, 285, 287, 256; 326/68, 75, 83, 89, 126, 30; 330/252

[56] References Cited

U.S. PATENT DOCUMENTS

| | | | |
|---|---|---|---|
| 4,713,600 | 12/1987 | Tsugaru et al. | 327/333 |
| 4,795,923 | 1/1989 | Dobos | 327/280 |
| 4,943,741 | 7/1990 | Estrada et al. | 326/89 |
| 5,115,148 | 5/1992 | Kammerl et al. | 327/333 |
| 5,289,136 | 2/1994 | DeVeirman et al. | 330/252 |
| 5,381,113 | 1/1995 | Kimura | 330/253 |
| 5,461,335 | 10/1995 | Tsuchiya | 327/280 |
| 5,465,057 | 11/1995 | Takahashi | 326/66 |

FOREIGN PATENT DOCUMENTS

| | | |
|---|---|---|
| 41 00 278 | 7/1991 | Germany . |
| 1-93919 | 4/1989 | Japan ........................ 327/333 |
| 1-236812 | 9/1989 | Japan ........................ 327/333 |
| 2-36611 | 2/1990 | Japan ........................ 327/333 |
| WO 89/01262 | 2/1989 | WIPO . |

OTHER PUBLICATIONS

IEEE Standard for Low–Voltage Differential Signals for SCI (LVDS), Draft 1.0 IEEE Std 1596.3–1994, Dec. 30, 1993, pp. 1–28.

IEICE Proceedings of Autumn Conference 1994, SC–9–10, p. 250, "A High Speed Driving Scheme for On–Chip Long Lines with High Resistance", H. Yamashita, et al., 1994.

Reich et al, "Theory and Applications of Active Devices", D. Van Nostrand Co., Inc., 1966, pp. 314–315, 324–327.

Schiling et al, *Electronic Circuits: Discrete and Integrated*, 2nd Edition, McGraw–Hill, 1979, Chapter 6, pp. 244–273.

*Primary Examiner*—Timothy P. Callahan
*Assistant Examiner*—Terry L. Englund
*Attorney, Agent, or Firm*—Oblon, Spivak, McClelland, Maier & Neustadt, P.C.

[57] ABSTRACT

An input circuit includes a pair of common-base circuits having respective transistors including respective bases to which differential signals transmitted through a transmission line are input and constant current sources connected to the emitters of the transistors, and a level shift circuit for inputting, to the emitters of the common-base circuits, differential signals with anti-phase relation to the differential signals input to the bases of the common-base circuits. This input circuit has lower power consumption and can be used to match impedance.

9 Claims, 5 Drawing Sheets

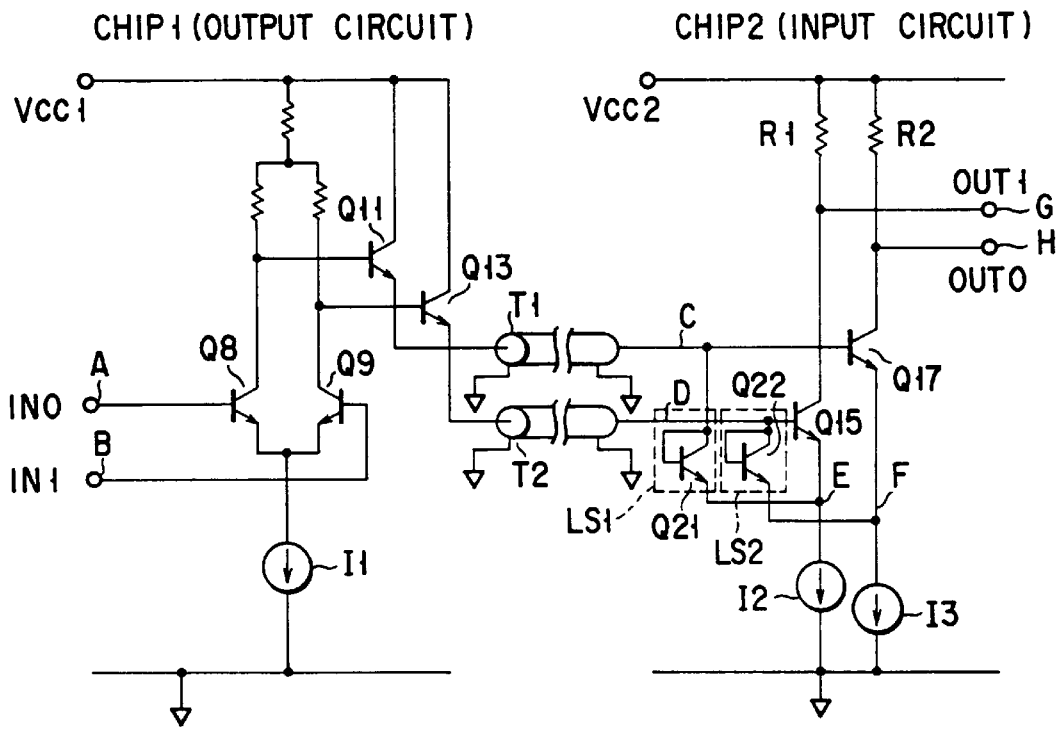
F I G. 1
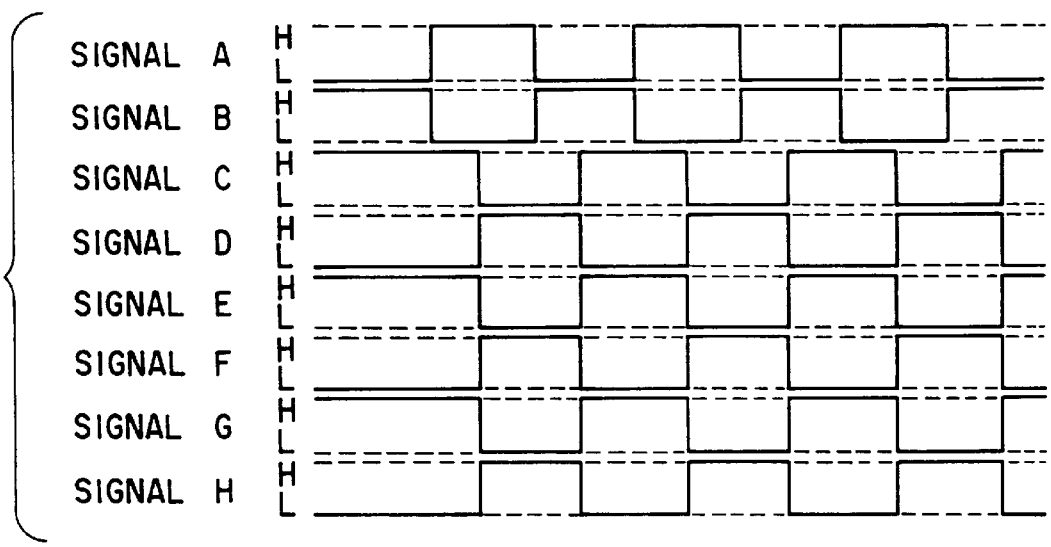
F I G. 2

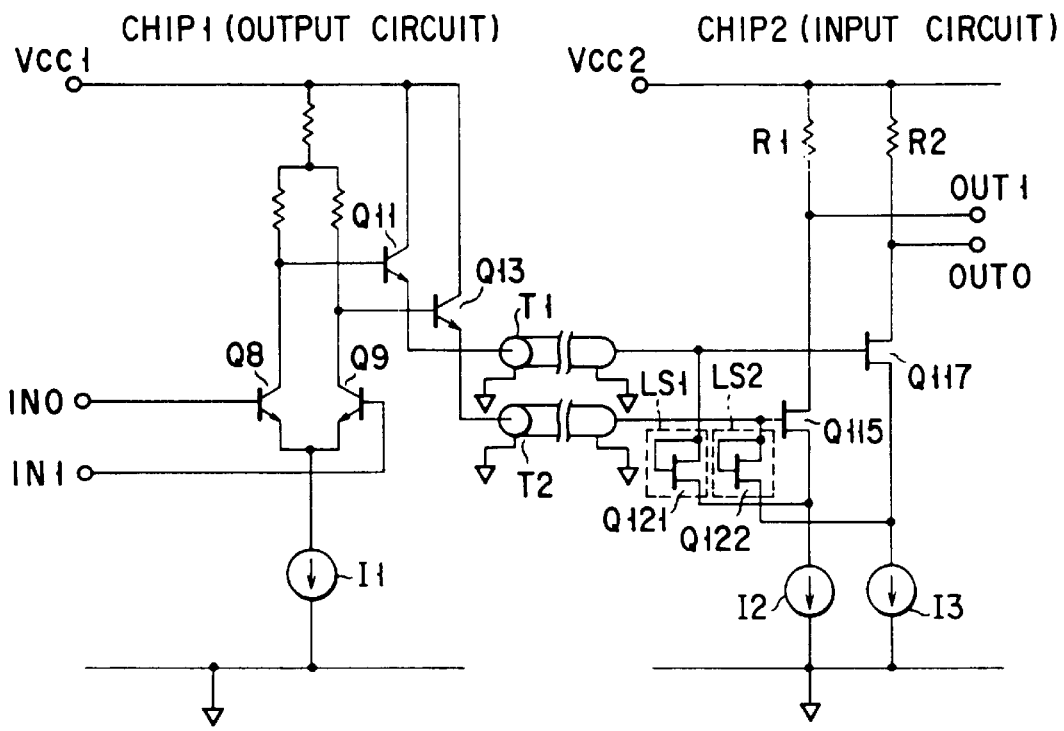
F I G. 5
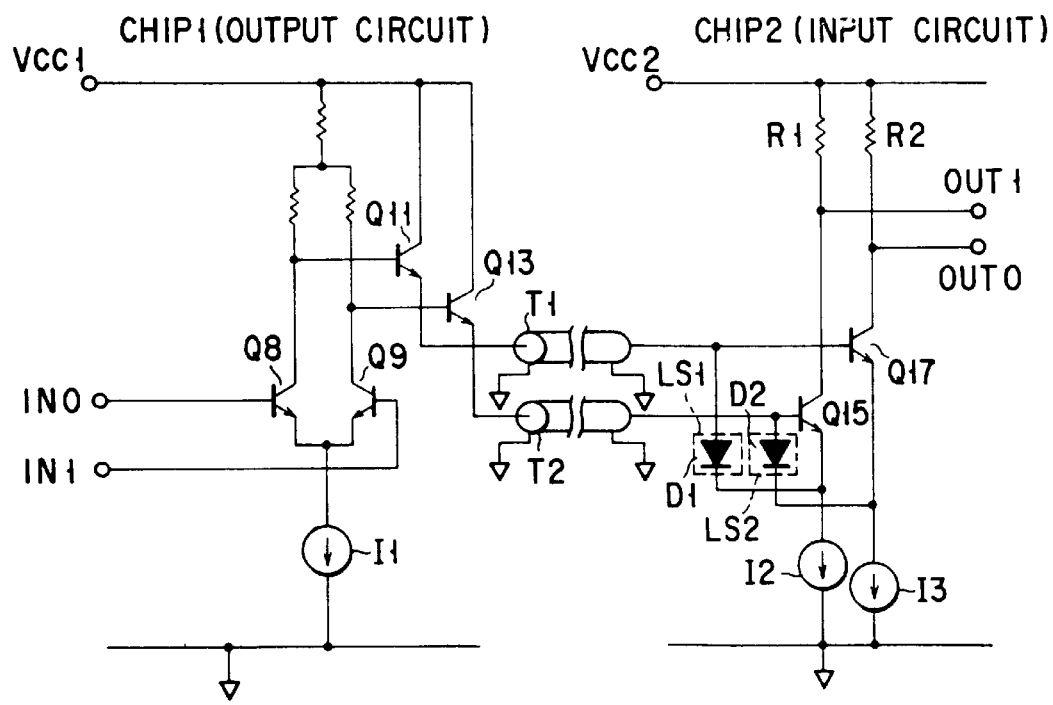
F I G. 6

INPUT CIRCUIT DEVICE WITH LOW POWER CONSUMPTION

BACKGROUND OF THE INVENTION

1. Field of the Invention

This invention relates to an input circuit for use in transmitting a signal to a circuit device operating in a high speed such as an I/O interface used for inputting/outputting of a signal between semiconductor devices, or an I/O interface for inputting/outputting of a signal between a clock signal distribution circuit and each of the circuit components which are provided in an IC via a long wiring line.

2. Description of the Related Art

In an interface used in a circuit such as an ECL circuit for inputting/outputting of a signal, an open emitter circuit is generally used as the signal output section. Used as the signal input section, the input circuit having 50Ω terminal resistance and terminal voltage of −2 V. The specification of such an I/O circuit is determined by the voltage amplitude of the signal output section. Generally, the signal output section requires about 1 volt between the high and low levels of the signal. Accordingly, the interface between the signal input and output sections consumes a remarkably great amount of power.

In order to reduce the power consumption, the signal input section comprises an input circuit using a common-base circuit, i.e., a circuit in which the base is common to input and output circuits, in which a signal is input to an emitter. The input circuit can operate even if the voltage amplitude of the input signal is small. This is why it has been conventionally used to suppress the power consumption.

In a case of distributing a high-speed signal such as a clock signal to each circuit element in a high-speed large-scale integrated circuit, the conventional devices employ an interface system using a voltage amplitude. In this case, the scale of the IC and the wiring length in the IC increase, so that the resistance and parasitic capacitance of the signal line and the capacitance of the input circuit increases. Consequently, the voltage amplitude of the input signal decreases and the signal delay in the wiring increases.

In order to solve this problem, a high-speed transmission system is proposed, in which a signal is input in the emitter of the common-base circuit as a current-sense type circuit. Such a system has been conventionally suggested as a novel interface circuit. However, when the operation of the voltage generator connected to the base of the circuit is unstable and the voltage generator is apt to generate the noise, the input circuit may malfunction if the input signal has a small voltage amplitude. To prevent the malfunction of the input circuit, the voltage generator with high stability needs to be used as the voltage source in the circuit.

SUMMARY OF THE INVENTION

The object of the present invention is to provide an input circuit having a simple and efficient circuit structure including a common-base input circuit useful as a low power consumption circuit.

According to the present invention, there is provided an input circuit which comprises a pair of common control-terminal circuits which have respective transistors including respective control terminals supplied with differential signals input through a transmission line and respective charge injection terminals, and a constant current source connected to the charge injection terminals of the transistors; and a phase change circuit for inputting, to the charge injection terminals of the pair of common control-terminal circuits, differential signals in the anti-phase with respect to the differential signals input to the control terminals of the transistors of the common control-terminal circuits.

The phase change circuit comprises a first diode-connected transistor which is connected between the base of a first transistor and the emitter of a second transistor, and a second diode-connected transistor which is connected between the base of a second transistor and the emitter of the first transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram of the signal transmission section using the input circuit of one embodiment of the present invention;

FIG. 2 is a timing chart of the signals at each nodes of the input circuit of FIG. 1;

FIG. 5 is a circuit diagram of the input circuit of another embodiment of the present invention, which comprises FETs, such as JFETs;

FIG. 6 is a circuit diagram of the input circuit of one another embodiment of the present invention, which comprises diodes;

DETAILED DESCRIPTION OF THE PREFERRED EMBODIMENTS

Figure 3:
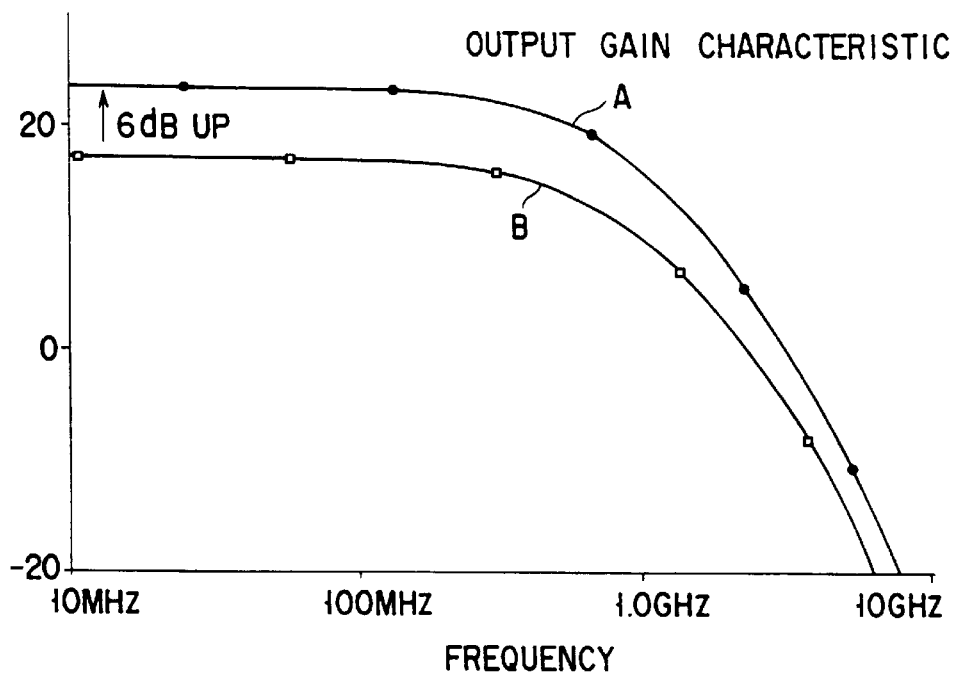
FIG. 3 is a graph showing the voltage gain characteristics of the conventional input circuit and that of the present invention.

FIG. 1 shows the I/O circuit comprising the input circuit according to the one embodiment of the present invention. In this circuit, bipolar transistors Q8 and Q9 which have the bases connected to input terminals IN0 and IN1 constitute a differential circuit. The differential circuit is arranged between a voltage line $V_{CC}$ and a ground line so as to be connected with a constant current source 11 in series. The bipolar transistors Q11 and Q13 constitute an open-emitter ECL output circuit. The ECL output circuit is connected between the voltage line $V_{CC}$ and transmission lines T1 and T2 and output signals to the input circuit of chip 2 through the transmission lines T1 and T2.

The charge injection terminals (i.e., emitters) of the transistors Q11 and Q13 of the ECL output circuit are respectively connected through the transmission lines T1 and T2 to the control terminals (i.e., bases) of bipolar transistors Q17 and Q15 constituting a common-base circuit in the input circuit. The emitter of the transistor Q15 is connected to a level shift circuit LS1 including a diode-connected transistor Q21 for shifting the signal level and connected to the transistor Q11 through the transmission line T1. Similarly to the transistor Q15, the emitter of the transistor Q17 is connected to a level shift circuit LS2 including a diode-connected transistor Q22 for shifting the signal level and connected to the transistor Q13 through the transmission line T2. The base of the transistor Q15 of the input circuit is connected to the transistor Q13 of the output circuit, and the emitter of the transistor Q15 is connected to the transistor Q11 via transistor Q21. Similarly, the base of the transistor Q17 of the input circuit is connected to the transistor Q11 of the output circuit in chip 1, and the emitter of the transistor Q17 is connected to the transistor Q13 via transistor Q22. The emitters of the transistors Q15 and Q17 are connected to constant current sources 12 and 13, respectively. The collectors of the transistors Q15 and Q17 are connected to a voltage line $V_{CC}$ 2 via resistors R1 and R2 and connected to output terminals OUT1 and OUT0, respectively.

The operation of the circuit constituted as above will be described below with reference to the timing chart of FIG. 2.

When signals A and B are input to the input terminals of the chip 1, differential signals are output from the transistors Q11 and Q13 of the ECL output circuit of the chip 1. The differential signals are input to the bases of the transistors Q17 and Q15 through the transmission lines T1 and T2, as signals C and D. The potentials of the input signals C and D are lowered by the level shifting transistors Q21 and Q22, and input to the emitters of the transistor Q15 and Q17, as signals E and F. Stated differently, the differential signals of the transistors Q11 and Q13 of the ECL output circuit are input as the signals C and F to the base and emitter of the transistor Q17, respectively, and input as the signals E and D to the emitter and base of the transistor Q15, respectively. More specifically, the anti-phase signals with respect to the signals input to the emitters of the transistors Q15 and Q17 are input to the bases of the transistors Q15 and Q17. By supplying the signals in this manner, the voltage amplitude of the signals output to the charge collection terminals (i.e., collectors) of the transistors Q15 and Q17 is doubled that of the conventional circuit when the load resistances R1 and R2 have the same resistance value.

The following is the description of the differences between the input circuit of the present invention and the conventional input circuit in frequency characteristics related to the voltage gains, in conjunction with FIG. 3. These frequency characteristics are obtained by measuring the frequencies of the signals G and H output from the output terminals OUT1 and OUT2 when the signals are input to the input terminals IN0 and IN1. As is clear from this graph, the output gain characteristic A of the input circuit of the present invention has the same frequency band as that of the conventional input circuit, but is higher than the output gain characteristics B of the conventional input circuit by 6 dB.

Figure 4:
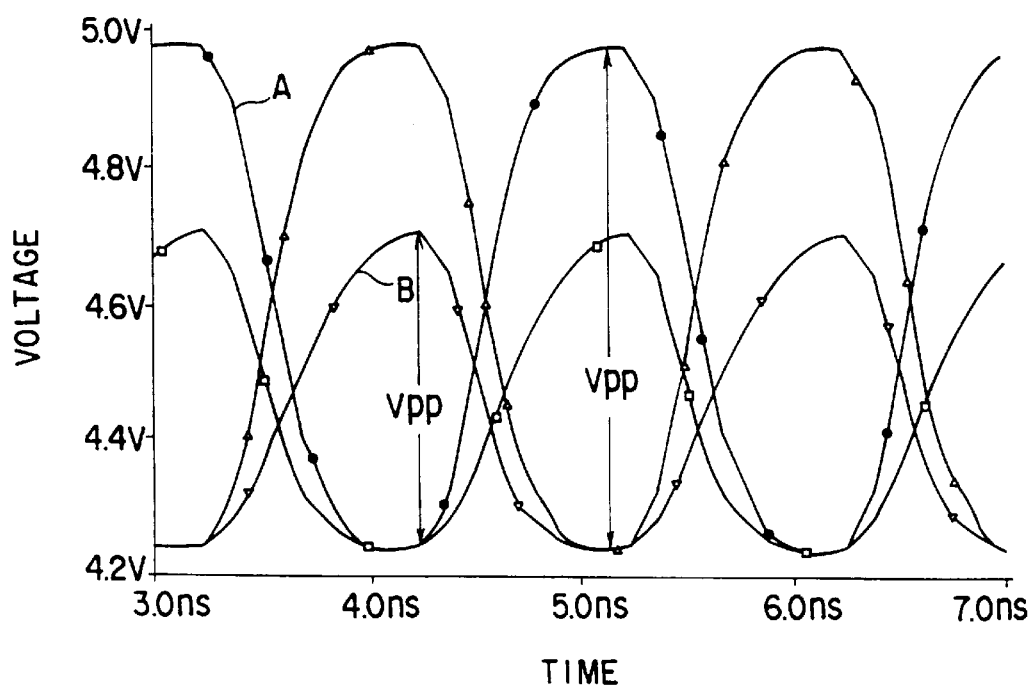
FIG. 4 is a graph showing the voltage amplitude characteristics of the conventional input circuit and that of the present invention.

FIG. 4 shows the characteristics of the voltage amplitude of the output signals of the input circuit of the present invention shown in FIG. 1 and of the conventional input circuit. Similarly to FIG. 3, these voltage amplitude characteristics are also obtained by measurement. According to the measurement, in the same power consumption, the voltage amplitude of the characteristic of the conventional input circuit is no more than 0.4 Vpp as shown by curve B, while the voltage amplitude of that of the present invention is approximately 0.8 Vpp as shown by curve A. Further, the waveform of the conventional input circuit is deformed, while the present invention obtains a good waveform wherein the rising and falling are symmetrically arranged.

In the above embodiment, the common-base circuit is used as an input circuit. The common-gate circuit using the field effect transistors, i.e., JFETs Q115 and Q117 may be used instead of the common-base circuit, as shown in FIG. 5. In the common-gate circuit, the differential signal output from the transistor Q11 is input to the control terminal (i.e., gate) of a JFET Q117 and to the charge injection terminal (i.e., source) of the JFET Q115 via a level shift circuit LS1 including a diode-connected JFET Q121. Similarly, the differential signal output from the transistor Q13 is input to the gate of the JFET Q115 and to the source of the JFET Q117 via a level shift circuit LS2 including a diode-connected JFET Q122. In other words, the anti-phase signals with respect to the signals input to the gates of the JFETs Q115 and Q117 are input to the sources of the JFETs Q115 and Q117. By providing the signals in this manner, the voltage amplitude of the signals output to the output terminals OUT1 and OUT2 connected to the charge collecting terminals (i.e., drains) of the JFETs Q115 and Q117 is doubled that of the conventional circuit when the load resistances R1 and R2 have the same resistance value.

In the above-described embodiment, common base circuit and common-gate circuit may be replaced with a Darlington connection circuit.

The level shift circuits LS1 and LS2 may comprise diodes D1 and D2 as shown in FIG. 6 in the stead of the diode-connected transistors Q21 and Q22 or the diode-connected transistors JFETs Q121 and Q122. Also, the level shift circuits LS1 and LS2 may be constructed by resistors or a level shifting voltage source.

Figure 7:
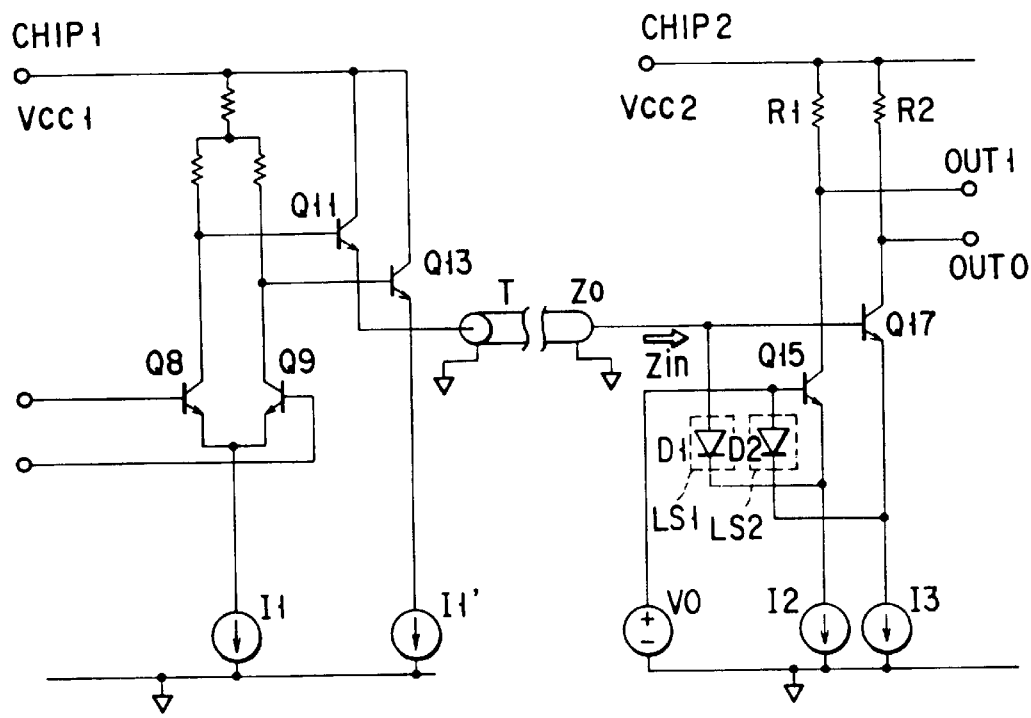
FIG. 7 are circuit diagrams of the input circuits of still another embodiment of the present invention, which are used for a single-phase transmission system.

In the above embodiment, a two-phase transmission line is provided, but a single-phase transmission line can be used instead thereof, as shown in FIG. 7. In this time, the emitter of the transistor Q11 of the ECL output circuit of the chip 1 is connected to the transmission line T, and the emitter of the transistor Q13 is connected to the constant current source I1'. In the chip 2, the transmission line T is connected to the base of the transistor Q17 of the common base circuit and to the emitter of the transistor Q15 via the diode D1 of a level shift circuit LS1. The base of the transistor Q15 is connected to the voltage source V0 and to the emitter of the transistor Q17 via the diode D2 of a level shift circuit LS2.

According to the above-mentioned embodiment shown in FIG. 7, the signal output from the transistor Q11 of the ECL output circuit is supplied to the base of the transistor Q17 through the transmission line T and transmitted to the emitter of the transistor Q15 via the diode D1. The base of the transistor Q15 and the emitter of the transistor Q17 are applied with a constant voltage by the voltage source V0. When the potential of the input signal is set at L (a low level), the transistor Q15 is turned ON and the transistor Q17 is turned OFF. Accordingly, the potential of the output terminal OUT1 is set at L, and that of the output terminal OUT0 is set at H (a high level). When the input signal is set at H, the transistor Q15 is turned OFF and the transistor Q17 is turned ON. Accordingly, the potential of the output terminal OUT1 is set at L, with the result that the potential of the output terminal OUT1 is set at H and the potential of the output terminal OUT0 is set at L. The signals output to the output terminals are shown as the signals G and H in the timing chart of FIG. 2.

In the above embodiments, the input impedance of the input circuit can be controlled to be approximately equal to the characteristic impedance by replacing the constant current sources I2 and I3 with the elements having low impedance, such as resistors, or by adjusting the size of the transistors Q15 and Q17. By controlling the input impedance of the input circuit, the signal reflection in the input circuit due to the mismatch of the impedance in the signal input section can be prevented.

There will now be described an embodiment for realizing an impedance matching with reference to FIG. 8. In this embodiment, the characteristic impedance Z0 and the impedance Zin of the input circuit of the chip 2 are matched.

According to this embodiment, the transmission lines T1 and T2 are respectively connected to the bases of the bipolar transistors Q17 and Q15 of the common-base circuit and to the emitters of the transistors Q15 and Q17 via the diodes D1 and D2. The collectors of the transistors Q15 and Q17 are connected to the voltage line $V_{CC}2$ via resistance R1 and R2 via the diodes D1 and D2 of level shift circuits LS1 and LS2, and the emitters are connected to the ground line via impedance matching resistors R3 and R4. To match the impedances, the input impedance Zin needs to be set as being Zin≅Zo.

where Zo is the characteristic impedance of the transmission line. In other words, Zin is as follows:

$$Zin = \frac{Z_{Q17b}(R_{D1}Z_{Q15e} + R_{D1}R_{R3} + Z_{Q15e}R_{R3})}{Z_{Q17b}Z_{Q15e} + Z_{Q17b}R_{R3} + R_{D1}Z_{Q15e} + R_{D1}R_{R3} + Z_{Q15e}R_{R3}}$$

wherein $Z_{Q17b}$: input impedance of the base of the transistor Q17;

$R_{D1}$: forward bias resistor of the diode D1;

$Z_{Q15}e$ : input impedance of the emitter of the transistor Q15; and $R_{R3}$: resistance value of the resistor R3.

Figure 8:
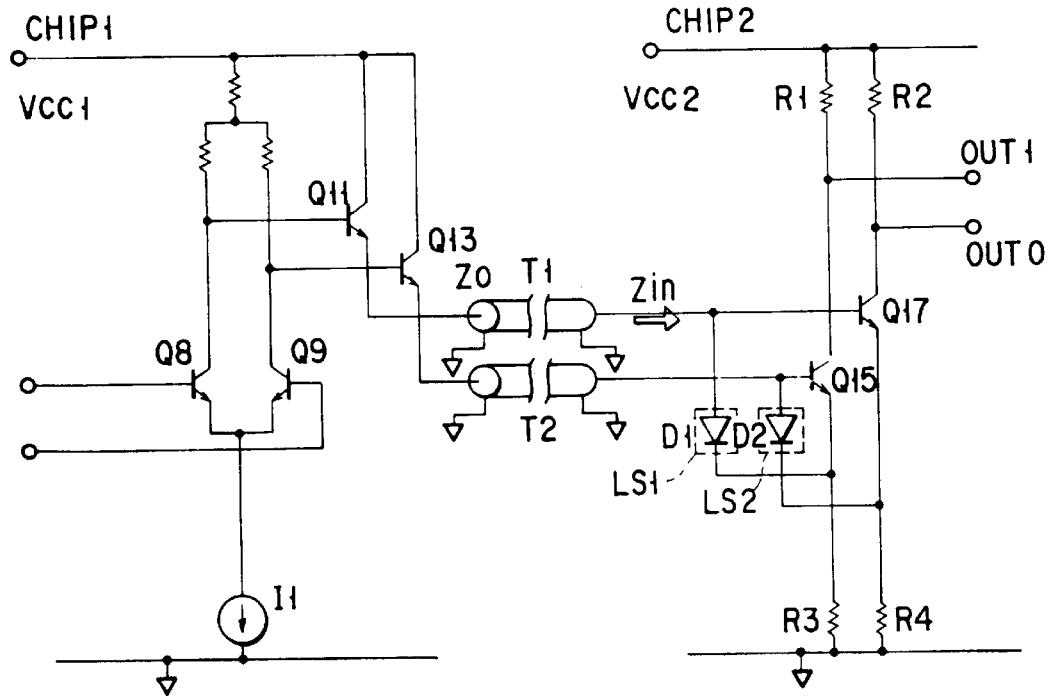
FIG. 8 is a circuit diagram of the input circuit of further another embodiment of the present invention, which has a function of matching input impedance.

According to the embodiment shown in FIG. 8, the input impedance matching of the transmission line and the input circuit can be attained. In this state, the power of the signal input to the input circuit is constantly set at the maximum, and the deformation of the signal waveform is very small. The diodes used in this embodiment can be replaced with diode-connected transistors. Similarly, the input circuit can be constituted so as to be applied to the single phase transmission system as shown in FIG. 7. Also, the level shift circuits LS1 and LS2 each may comprise a diode-connected transistor, a resistor or a level shifting voltage source.

Figure 9:
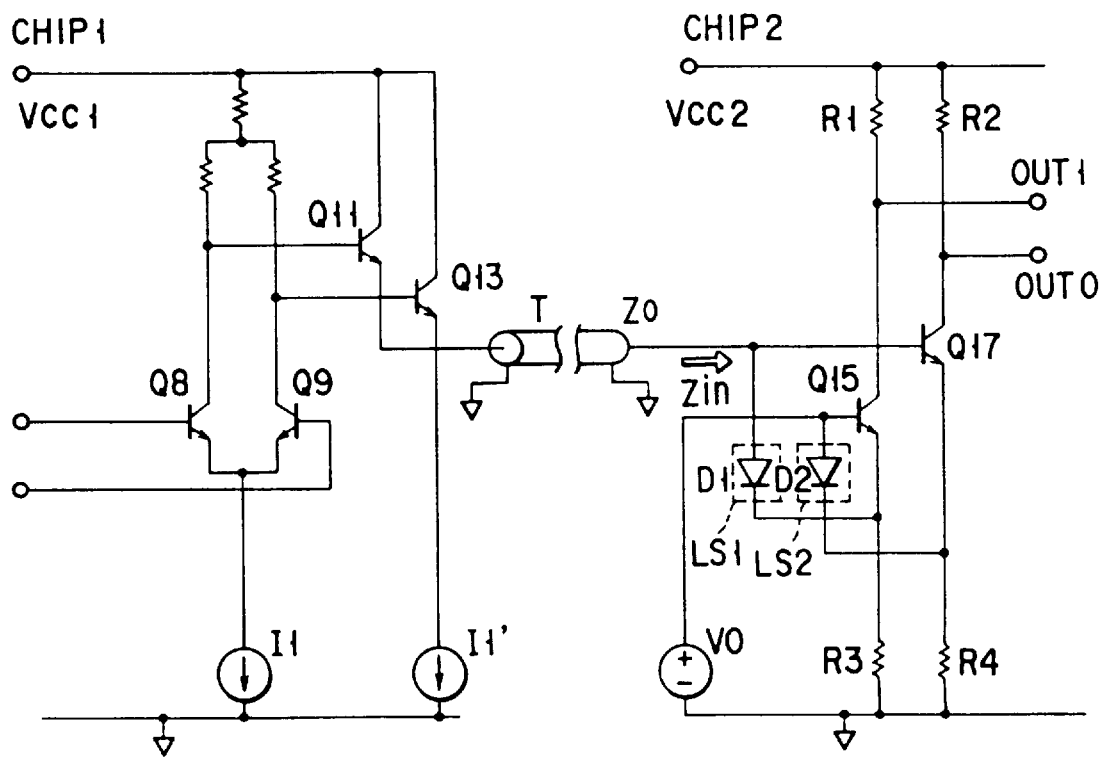
FIG. 9 is a circuit diagram of the input circuit of further another embodiment of the present invention, which has a function of matching input impedance in a single-phase transmission system.

FIG. 9 shows an embodiment for realizing an impedance matching in a single-phase transmission system.

In this embodiment, the constant current sources I2 and I3 of the input circuit shown in FIG. 7 are replaced with impedance matching resistors R3 and R4 shown in FIG. 8.

As described above, according to the present invention, a complex voltage generator necessary for the conventional input/output circuit is not needed to be provided. Further, the present invention attains the voltage amplitude double of that of the conventional circuit, the improvement of the signal waveform, and the high-speed circuit with low power consumption.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An input circuit comprising:

a pair of common-control-terminal circuits which have respective transistors including respective control terminals to which first signals transmitted through a pair of transmission lines are input, respectively, and respective charge injection terminals, and respective constant current sources connected to said charge injection terminals; and a phase change circuit connecting the control terminal of one of the transistors to the charge injection terminal of the other of the transistors and connecting the control terminal of the other of the transistors to the charge injection terminal of the one of the transistors, wherein a second signal input to the charge injection terminal of each respective transistor is in an anti-phase relation with the first signal input to the control terminal of said respective transistor;

wherein said pair of common-control-terminal circuits comprises a pair of common-gate circuits having respective FETs, corresponding to said respective transistors, wherein said FETs include respective gates corresponding to said control terminals and respective sources corresponding to said charge injection terminals;

wherein said phase change circuit comprises a first level shift circuit connected to said gate of one of said FETs and said source of the other of said FETs and a second level shift circuit connected between said gate of said other of said FETs and said source of said one of said FETs wherein said first level shift circuit includes one of a first diode, a first diode-connected transistor, a first resistor and a first level shift voltage source which is connected between said gate of said one of said FETs and said source of said other of said FETs and said second level shift circuit includes one of a second diode, a second diode-connected transistor, a second resistor and a second level shift voltage source which is connected between said gate of said other of said FETs and said source of said one of said FETs.

2. An input circuit comprising:

a pair of common-control-terminal circuits which include respective transistors having respective control terminals to which first signals transmitted through a pair of transmission lines are input and respective charge injection terminals and a pair of constant current sources which are connected to said charge injection terminals of said transistors, respectively, and have an impedance matching characteristic wherein impedance of said transmission lines and input impedance of said input circuit are matched; and a phase change circuit connecting the control terminal of one of the transistors to the charge injection terminal of the other of the transistors and connecting the control terminal of the other of the transistors to the charge injection terminal of the one of the transistors, wherein a second signal input to the charge injection terminal of each respective transistor is in an anti-phase relation with the first signal input to the control terminal of said respective transistor;

wherein said pair of common-control-terminal circuits comprises a pair of common-gate circuits having respective FETs corresponding to said respective transistors, wherein said FETs include respective gates corresponding to said control terminals and respective sources corresponding to said charge injection terminals wherein said phase change circuit comprises a first level shift circuit connected to said gate of one of said FETs and said source of the other of said FETs and a second level shift circuit connected between said gate of said other of said FETs and said source of said one of said FETs wherein said first level shift circuit includes one of a first diode, a first diode-connected transistor, a first resistor and a first level shift voltage source which is connected between said gate of said one of said FETs and said source of said other of said FETs and said second level shift circuit includes one of a second diode, a second diode-connected transistor, a second resistor and a second level shift voltage source which is connected between said gate of said other of said FETs and said source of said one of said FETs.

3. An input circuit comprising:

a pair of common-control-terminal circuits, which have a first transistor including a control terminal to which a signal transmitted through a transmission line is input and a charge injection terminal, a second transistor including a control terminal and a charge injection terminal, a voltage source applying a bias voltage to said control terminal of said second transistor, and a pair of constant current sources connected to said charge injection terminals of said first and second transistors, respectively; and a supply circuit for supplying said signal input to said control terminal of said first transistor to said charge injection terminal of said second transistor and supplying said bias voltage of said voltage source which is applied to said control terminal of said second transistor to said charge injection terminal of said first transistor.

4. An input circuit according to claim 3, wherein said pair of common-control-terminal circuits comprise a pair of common-base circuits having first and second bipolar transistors, corresponding to said first and second transistors, wherein said bipolar transistors include bases corresponding to said control terminals and emitters corresponding to said charge injection terminals.

5. An input circuit according to claim 4, wherein said supply circuit comprises a first level shift circuit connected between said base of said first bipolar transistor and said emitter of said second bipolar transistor and a second level shift circuit connected between said base of said second bipolar transistor and said emitter of said first bipolar transistor.

6. An input circuit according to claim 3, wherein said constant current sources each have an impedance matching characteristic wherein impedance of said transmission line and input impedance of said input circuit are matched.

7. An input circuit according to claim 6, wherein said constant current sources each comprises a resistor.

8. An input circuit according to claim 3, wherein said supply circuit comprises a first level shift circuit connected between said control terminal of said first transistor and said charge injection terminal of said second transistor and a second level shift circuit connected between said control terminal of said second transistor and said charge injection terminal of said first transistor.

9. An input circuit according to claim 8, wherein said first level shift circuit includes one of a first diode, a first diode-connected transistor, a first resistor and a first level shift voltage source which is connected between said control terminal of said first transistor and said charge injection terminal of said second transistor, and said second level shift circuit includes one of a second diode, a second diode-connected transistor, a second resistor and a second level shift voltage source which is connected between said control terminal of said second transistor and said charge injection terminal of said first transistor.

* * * * *